(12) United States Patent
Lai

(10) Patent No.: US 8,148,847 B2
(45) Date of Patent: Apr. 3, 2012

(54) POWER SOURCE SYSTEM WITH CONTINUOUSLY ADJUSTABLE OUTPUT

(75) Inventor: Chih-Chen Lai, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 321 days.

(21) Appl. No.: 12/607,176

(22) Filed: Oct. 28, 2009

(65) Prior Publication Data

US 2010/0264742 A1 Oct. 21, 2010

(30) Foreign Application Priority Data

Apr. 21, 2009 (CN) .......................... 2009 1 0301735

(51) Int. Cl.
*H02J 1/00* (2006.01)

(52) U.S. Cl. ............................... 307/71; 307/80; 361/15

(58) Field of Classification Search .................. 307/71, 307/80; 361/15
See application file for complete search history.

(56) References Cited

U.S. PATENT DOCUMENTS

| 6,430,692 | B1 * | 8/2002 | Kimble et al. ................ 713/300 |
| 7,239,194 | B2 * | 7/2007 | Azrai et al. .................... 327/536 |
| 2006/0092583 | A1 * | 5/2006 | Alahmad et al. ................ 361/15 |
| 2011/0018352 | A1 * | 1/2011 | Lai .................................. 307/80 |

* cited by examiner

*Primary Examiner* — Jared Fureman
*Assistant Examiner* — Alfonso Perez Borroto
(74) *Attorney, Agent, or Firm* — Altis Law Group, Inc.

(57) ABSTRACT

An exemplary power source system includes a power source, controller, and a voltage fine adjusting unit. The power source includes a number of cells and a number of switches configured for connecting the cells in series or in parallel. The controller is configured for coarsely controlling an output of the power source by selectively turning on and off the switches. The voltage fine adjusting unit is configured for further and finely adjusting the output of the power source on condition that the coarsely controlled output of the power source is outside a predetermined acceptable range of output.

13 Claims, 2 Drawing Sheets

POWER SOURCE SYSTEM WITH CONTINUOUSLY ADJUSTABLE OUTPUT

CROSS-REFERENCE TO RELATED APPLICATION

This application is related to a copending U.S. patent application Ser. No. 12/558,223 filed Sep. 11, 2009 and entitled "VARIABLE POWER SOURCE AND RELATED POWER SUPPLY METHOD," and which has the same assignees as the present application. The disclosure of the above-identified application is incorporated herein by reference.

BACKGROUND

1. Technical Field

The present disclosure relates to power sources and, particularly, to a power source system capable of continuously adjusting an output thereof to meet the requirements of a variable load.

2. Description of Related Art

Current electric systems typically include a power source, a driving circuit, and a load. The load may consume different amounts of power at different times. In such case, the driving circuit is configured for altering an output of the power source to meet the requirements of the load. For example, the driving circuit may include an inverter for converting a direct current flowing out from the power source into an alternate current, and/or a transformer for adjusting an output voltage of the power source. In such an electric system, a great amount of power may be lost in the driving circuit itself when the driving circuit provides power for the load. Thus, the voltage provided to the load may be reduced, and accordingly the adjustment of the power provided to the load may not be precise.

Therefore, it is desirable to provide a power source system which can overcome the above-mentioned problems.

DETAILED DESCRIPTION

Figure 1:
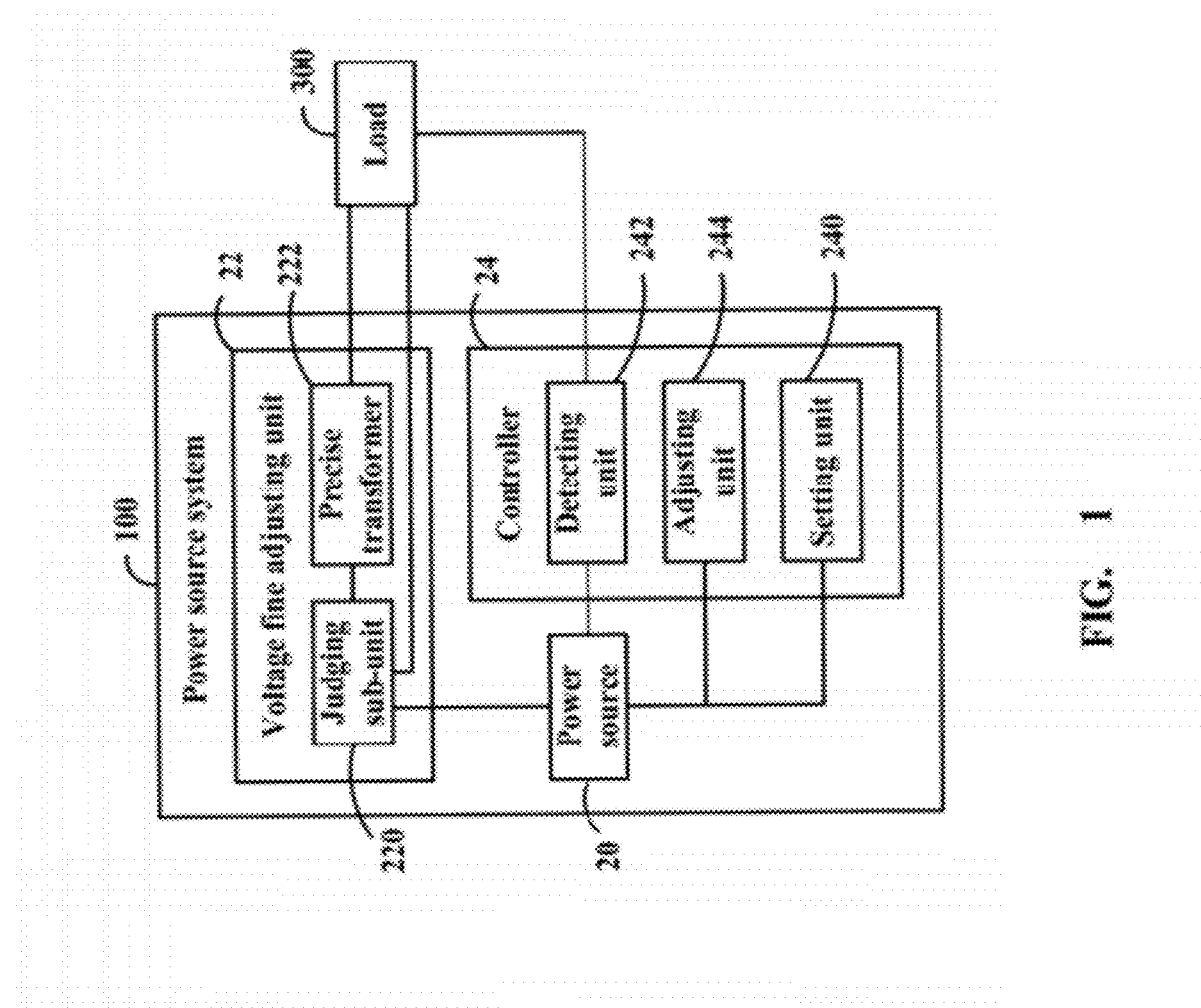
FIG. 1 is a block diagram of a power source system of an exemplary embodiment of the present disclosure, together with a load.
Figure 2:
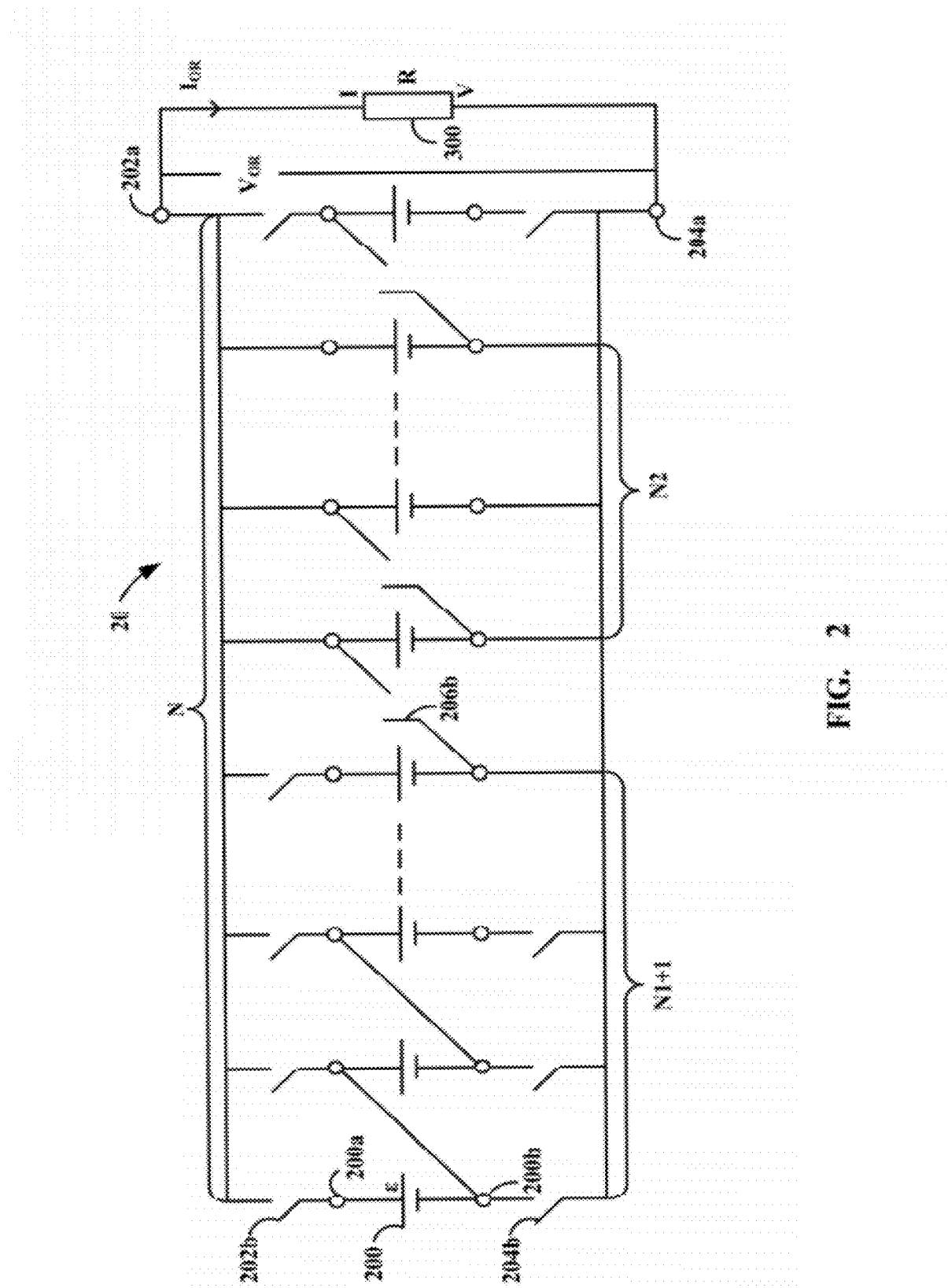
FIG. 2 is a schematic view of a power source of the power source system of FIG. 1, together with the load.

Referring to FIG. 1, a power source system 100, according to an exemplary embodiment, is shown. The power source system 100 is configured for supplying power for a load 300. The power source system 100 includes a power source 20, a voltage fine adjusting unit 22, and a controller 24. The load 300 has a resistance R. The rated voltage and rated flow of electrical current of the load 300 are represented as V and I respectively.

The power source 20 is configured for storing electric energy and providing electric energy to the load 300. In particular, the power source 20 includes a number of cells 200, a number of positive switches 202b, a number of negative switches 204b, a number of serializing switches 206b, a positive output 202a, and a negative output 204a. In this embodiment, the number of cells 200 is N, the number of positive switches 202b is N, the number of negative switches 204b is N, and the number of serializing switches 206b is N, wherein N is a natural number.

The cells 200 can be dry batteries, rechargeable batteries or solar batteries. Each of the cells 200 includes a positive electrode 200a and a negative electrode 200b. An electromotive force $\epsilon$ of the cells 200 is typically fixed.

The positive switches 202b, the negative switches 204b, and the serializing switches 206b can be, among other types, push-button switches, thin film switches, toggle switches, mercury tilt switches, lever switches, micro switches, or travel switches. In this embodiment, all the positive switches 202b, the negative switches 204b, and the serializing switches 206b are integrated into a grammed switch.

In assembly, the cells 200 are arranged in parallel. Each of the positive switches 202b connects a positive electrode 200a of a corresponding cell 200 to the positive output 202a. Each of the negative switches 204b connects a negative electrode 200b of a corresponding cell 200 to the negative output 204a. Each of the serializing switches 206b connects a negative electrode 200b of a corresponding cell 200 to a positive electrode 200a of an adjacent cell 200.

The controller 24 is configured for controlling the output of the power source 20 by selectively turning on and turning off the positive switches 202b, the negative switches 204b, and the serializing switches 206b. The controller 24 includes a setting unit 240, a detecting unit 242, and an adjusting unit 244.

The setting unit 240 is configured for selectively turning on and turning off the positive switches 202b, the negative switches 204b, and the serializing switches 206b to control an output voltage of the power source 20 before starting supplying power to the load 300. In particular, a serializing number N1 and a parallelizing number N2 are calculated by the setting unit 240 using, for example, the following two formulas: (1): N1=[V/$\epsilon$]; and (2): N2=[IR/$\epsilon$-N]; wherein [V/$\epsilon$] represents rounding off V/$\epsilon$, and [IR/$\epsilon$-N] represents rounding off (IR/$\epsilon$-N). In the present embodiment, unless the context indicates otherwise, rounding off means simplifying a number with a decimal point to the nearest integer. In more detail, the setting unit 240 stores the electromotive force $\epsilon$ and the total number N of the cells 200. As such, once the resistance R, the rated voltage V, and the rated flow of electrical current I of the load 300 are inputted to the setting unit 240, the serializing number N1 and the parallelizing number N2 can be determined by the setting unit 240. Furthermore, the setting unit 240 can control the positive switches 202b, the negative switches 204b, and the serializing switches 206b by controlling the grammed switch to connect N1+1 of the cells 200 in series between the positive output 202a and the negative output 204a by switching on N1 of the serializing switches 206b, and, except for the N+1 serialized cells 200, by controlling the grammed switch to connect N2 of the cells 200 in parallel between the positive output 202a and the negative output 204a by switching on N2 of the positive switches 202b and N2 of the negative switches 204b of the N2 cells.

It should be understood that (N1+N2+1) should be less than N. Otherwise, the power source 20 cannot supply power for the load 300. Based upon the formula (1), it can be determined that a theoretical output voltage $V_{OT}$ of the power source 2000 is about (N1+1)$\epsilon$, which is, in theory, equal to or slightly higher than the rated voltage V of the load 300. Based upon both the formulas (1) and (2), it can be inferred that a theoretical flow of electrical current $I_{OT}$ through the load 300 is about (N1+N2+1)$\epsilon$/R , which is, in theory, equal to or slightly higher than the rated flow of electrical current I of the load 300. Thus the setting unit 240 is able to control the grammed switch such that both the rated voltage V and the rated flow of electrical current I of the load 300 can be satisfied. However, due to incremental exhausting of electric power of the cells 200 and incremental increasing of internal resistances of the cells 200, a real output voltage $V_{OR}$ and a real flow of electrical current $I_{OR}$ tend to deviate from the theoretical output voltage $V_{OT}$ and the theoretical flow of electrical current $I_{OR}$, respectively. Therefore, the detecting unit 242 and the adjusting unit 244 are employed to reduce or eliminate any such deviation.

The detecting unit 242 is configured for continuously measuring differences between the real output voltage $V_{OR}$ and the rated voltage V of the load 300, and differences between the real flow of electrical current $I_{OR}$ and the rated flow of electrical current I of the load 300.

The adjusting unit 244 is configured for continuously adjusting the output voltage $V_{OR}$ and the real flow of electrical current $I_{OR}$ by adjusting on/off states of the positive switches 202b, the negative switches 204b, and the serializing switches 206b, based upon the differences measured by the detecting unit 242.

As such, the real output voltage $V_{OR}$ can be coarsely maintained around the rated voltage V of the load 300. The real flow of electrical current $I_{OR}$ can be coarsely maintained around the rated flow of electrical current I of the load 300. This is because each of the real output voltage $V_{OR}$ and the real flow of electrical current $I_{OR}$ can only be adjusted incrementally (each increment is $\epsilon$ and $\epsilon/R$, respectively). Therefore, the real output voltage $V_{OR}$ and the real flow of electrical current $I_{OR}$ may need further fine adjustments to exactly meet the requirements of the load 300.

The voltage fine adjusting unit 22 is configured for precisely adjusting the real output voltage $V_{OR}$ and the real flow of electrical current $I_{OR}$. In particular, the voltage fine adjusting unit 22 includes a judging sub-unit 220 and a precise transformer 222. The judging sub-unit 220 judges whether differences between the real output voltage $V_{OR}$ and the rated voltage of the load 300 are within acceptable levels, and whether differences between the real flow of electrical current $I_{OR}$ and the rated flow of electrical current of the load 300 are within acceptable levels. If the determination is "yes" for both judgments (i.e., both within acceptable levels), the judging unit 220 directly passes the output of the power source 20 to the load 300. If the determination is "no" for either or both judgments (i.e., either or both not within acceptable levels), the judging unit 220 passes the output of the power source 20 to the precise transformer 222 for precise voltage adjustment, so that the output of the precise transformer 222 exactly meets the requirements of the load 300.

While various exemplary and preferred embodiments have been described, it is to be understood that the disclosure is not limited thereto. To the contrary, various modifications and similar arrangements (as would be apparent to those skilled in the art) are intended to also be covered. Therefore, the scope of the appended claims should be accorded the broadest interpretation so as to encompass all such modifications and similar arrangements.

What is claimed is:

1. A power source system comprising:
   a power source comprising:
      a positive output;
      a negative output;
      a plurality of cells, each of which comprises a positive electrode and a negative electrode;
      a plurality of positive switches, each of which is for connecting or disconnecting a corresponding positive electrode to the positive output;
      a plurality of negative switches, each of which is for connecting or disconnecting a corresponding negative electrode to the negative output; and
      a plurality of serializing switches, each of which is for connecting or disconnecting a positive electrode of a corresponding cell to a negative electrode of an adjacent cell;
   a controller configured for coarsely controlling a power output of the power source by selectively turning on or turning off each of the positive switches, the negative switches, and the serializing switches; and
   a voltage fine adjusting unit configured for further and finely adjusting the power output of the power source on condition that the coarsely controlled power output of the power source is outside a predetermined acceptable range of power output.

2. The power source of claim 1, wherein the cells are selected from the group consisting of dry batteries, rechargeable batteries, and solar batteries.

3. The power source of claim 1, wherein the positive switches, the negative switches, and the serializing switches are selected from the group consisting of push-button switches, thin film switches, toggle switches, mercury tilt switches, lever switches, micro switches, and travel switches.

4. The power source of claim 1, wherein the controller comprises a setting unit, a detecting unit, and an adjusting unit, the setting unit being configured to determine a serializing number and a parallelizing number before starting supplying power for a load using the following formulas: (1): $N1=[V/\epsilon]$ and (2): $N2=[IR/\epsilon-N]$, wherein N1 is the serializing number, V is a rated voltage of the load, $\epsilon$ is an electromotive force of each cell, $[V/\epsilon]$ represents rounding off $V/\epsilon$, N2 is the parallelizing number, I is a rated flow of electrical current of the load, R is a resistance of the load, N is a total number of the cells, $[IR/\epsilon-N]$ represents rounding off $(IR/\epsilon-N)$, and $(N1+N2+1)<N$, the setting unit being also configured to then connect N1+1 of the cells in series between the positive output and the negative output by switching on N1 of the serializing switches, and, except for the N+1 serialized cells, connect N2 of the cells in parallel between the positive output and the negative output by switching on N2 of the positive switches and N2 of the negative switches of the N2 cells; the detecting unit being configured for continuously measuring a difference between the power output of the power source and one or more predetermined rated requirements of the load; and the adjusting unit being configured for continuously adjusting the power output of the power source based upon the difference.

5. The power source of claim 1, wherein the voltage fine adjusting unit comprises a judging sub-unit and a precise transformer, the judging sub-unit being configured for judging whether the difference between the power output of the power source and the rated requirements of the load is within a predetermined acceptable range, and, on condition that the difference is within the predetermined acceptable range, directly passing the power output of the power source to the load, and, on condition that the difference is not within the predetermined acceptable range, passing the power output of the power source to the precise transformer for fine voltage adjustment so that a power output of the precise transformer exactly meets the rated requirements of the load.

6. A power source system comprising:
   a power source comprising a plurality of cells, and a plurality of switches arranged for selectively connecting a plurality of the plurality of cells in series and selectively connecting another plurality of the plurality of cells in parallel;
   a controller configured for coarsely controlling an output of the power source by selectively turning on and turning off the switches; and a voltage fine adjusting unit configured for further and finely adjusting the output of the power source on condition that the coarsely controlled output of the power source is outside a predetermined acceptable range of output.

7. The power source of claim 6, wherein the cells are selected from the group consisting of dry batteries, rechargeable batteries, and solar batteries.

8. The power source system of claim 6, wherein the power source further comprises a positive output and a negative output, each of the cells comprising a positive electrode and a negative electrode, the switches comprising a plurality of positive switches, each of which is for connecting a corresponding positive electrode to the positive output, and a plurality of negative switches, each of which is for connecting a corresponding negative electrode to the negative output.

9. The power source of claim 8, wherein the positive switches and the negative switches are selected from the group consisting of push-button switches, thin film switches, toggle switches, mercury tilt switches, lever switches, micro switches, and travel switches.

10. The power source system of claim 6, wherein the power source further comprises a positive output and a negative output, each of the cells comprising a positive electrode and a negative electrode, the switches comprising a plurality of serializing switches, each of the serializing switches arranged for selectively connecting a positive electrode of a corresponding cell to a negative electrode of an adjacent cell thereby connecting said plurality of the plurality of cells in series between the positive output and the negative output.

11. The power source of claim 10, wherein the serializing switches are selected from the group consisting of push-button switches, thin film switches, toggle switches, mercury tilt switches, lever switches, micro switches, and travel switches.

12. The power source of claim 6, wherein the controller comprises a setting unit, a detecting unit, and an adjusting unit, the setting unit being configured for determine a serializing number and a parallelizing number using the following formulas: (1): $N1=[V/\epsilon]$; and (2): $N2=[IR/\epsilon-N]$, before starting supplying power for a load, wherein N1 is the serializing number, V is a rated voltage of the load, $\epsilon$ is an electromotive force of each cell, $[V/\epsilon]$ represents rounding off $V/\epsilon$, N2 is the parallelizing number, I is a rated flow of electrical current of the load, R is a resistance of the load, N is a total number of the cells, $[IR/\epsilon-N]$ represents rounding off $(IR/\epsilon-N)$, and $(N1+N2+1)<N$, the setting unit, upon the calculation, being also configured to connect N1+1 cells in serials and, except for the N+1 serialized cells, N2 cells in parallel; the detecting unit being configured for continuously measuring a difference between the output of the power source and the rated requirements of the load, the adjusting unit being configured for continuously adjusting the output of the power source based upon the difference.

13. The power source of claim 6, wherein the voltage fine adjusting unit comprises a judging sub-unit and a precise transformer, the judging sub-unit being configured for judging whether the difference between the power output of the power source and the rated requirements of the load is within a predetermined acceptable range, and, on condition that the difference is within the predetermined acceptable range, directly passing the power output of the power source to the load, and, on condition that the difference is not within the predetermined acceptable range, passing the power output of the power source to the precise transformer for fine voltage adjustment so that a power output of the precise transformer exactly meets the rated requirements of the load.

* * * * *